Oct. 24, 1972 KARL-HEINZ JOHANNSMEIER 3,700,567

WAFER LOADING APPARATUS

Filed Nov. 12, 1970 4 Sheets-Sheet 1

INVENTOR.
KARL-HEINZ JOHANNSMEIER
BY Roland I. Griffin
ATTORNEY

Oct. 24, 1972 KARL-HEINZ JOHANNSMEIER 3,700,567

WAFER LOADING APPARATUS

Filed Nov. 12, 1970 4 Sheets-Sheet 2

INVENTOR

KARL-HEINZ JOHANNSMEIER

BY Roland I. Griffin

ATTORNEY

WAFER LOADING APPARATUS

Filed Nov. 12, 1970 4 Sheets-Sheet 3

INVENTOR
KARL-HEINZ JOHANNSMEIER
BY Roland I. Griffin
ATTORNEY

WAFER LOADING APPARATUS

Filed Nov. 12, 1970

INVENTOR
KARL-HEINZ JOHANNSMEIER
BY Roland J. Griffin
ATTORNEY

United States Patent Office 3,700,567

Patented Oct. 24, 1972

3,700,567

WAFER LOADING APPARATUS

Karl-Heinz Johannsmeier, 555 W. Middlefield, Road, Mountain View, Calif. 94040

Filed Nov. 12, 1970, Ser. No. 88,726
Int. Cl. H05k 13/04
U.S. Cl. 29—203 B 15 Claims

ABSTRACT OF THE DISCLOSURE

An optical alignment and exposure device is provided with wafer loading apparatus including a rotary loading arm pivotably mounted over a loading platform. The rotary loading arm includes a forked portion for engaging the side edge of a first unexposed wafer placed in a wafer loading position on the loading platform. It also includes another diametrically opposed forked portion for engaging the side edge of a second previously exposed wafer supported in a work area position on a vacuum chuck. The rotary loading arm rotates to slide the first unexpected wafer into the work area position on the vacuum chuck while at the same time sliding the second previously exposed wafer from the work area position on the vacuum chuck into an off-loading recess in the loading platform.

BACKGROUND OF THE INVENTION

Some optical alignment and exposure devices for exposing semiconductive wafers through a mask employ a rotary wafer loading apparatus including a rotatable loading platform carrying a pair of vacuum chucks. In this type of rotary wafer loading apparatus, the operator loads a wafer onto one of the vacuum chucks located in a wafer loading position and employs a forked aligning member associated with the loading appartus to orient the wafer in a predetermined work area position on this vacuum chuck. After this prealignment operation, the forked aligning member is moved away from the loaded vacuum chuck. The loading platform is there upon rotated to carry the loaded vacuum chuck to a working position while at the same time carrying the other vacuum chuck to the wafer loading position. In the working position, the loaded vacuum chuck is aligned with a structure for driving the vacuum chuck upward to position the wafer closer to or in contact with the mask as required to align the wafer with the mask and thereafter expose a photosensitive film on the wafer through the mask. One problem with this type of rotary wafer loading apparatus is that a rotatable loading platform carrying two vacuum chucks entails substantial mass and thus inertia, thereby reducing the wafer loading rate.

Another type of wafer loading apparatus, as disclosed in U.S. Pat. 3,490,846 issued Jan. 20, 1970, employs a pair of reciprocating wafer loading and off-loading forks mounted on a fixed loading platform. The loading fork slides a wafer, which is to be aligned with and exposed through the mask, from a loading position on the loading platform onto a vacuum chuck. After the wafer has been exposed, the off-loading fork slides the wafer off the vacuum chuck to an off-load position on the loading platform. While this type of reciprocating wafer loading apparatus is suitable for some applications, it is desired to increase the rate at which wafers can be loaded onto and unloaded from the vacuum chuck and, in addition, to improve the accuracy with which wafers can be loaded onto the vacuum chuck. The reciprocating loading and off-loading forks also require substantial operating space above the loading platform, whereas it is desired to reduce the space between the mask and the loading platform.

SUMMARY OF THE PRESENT INVENTION

The principal object of the present invention is the provision of an improved wafer loading apparatus.

One feature of the present invention is the provision, in a wafer loading apparatus, of a rotary loading arm adapted for engaging the side edge of a wafer at spaced points and pivoted with respect to a loading platform for sliding the wafer over a surface of the loading platform to a work area, whereby the wafer can be more accurately positioned at a faster rate with a less complex apparatus.

Another feature of the present invention is the same as the preceding feature wherein the rotary loading arm includes at least a pair of forked portions for engaging respective ones of a pair of wafers such that as the rotary loading arm is rotated to push one of the wafers into the work area it off-loads the other wafer from the work area. Each forked portion is shaped so that while the rotary loading arm is rotated, frictional forces between the wafer being pushed thereby and the loading platform and work area will prevent the wafer from walking out of the forked portion and will automatically press the wafer into the forked portion and orient the wafer in a predetermined position with respect to the rotary loading arm and the work area.

Another feature of the present invention is the same as any one or more of the preceding features wherein the work area is formed by a vacuum chuck and the rotary loading arm is driven with an angular velocity that increases as the wafer being loaded onto the vacuum chuck slides from the surface of the loading platform onto the vacuum chuck, whereby the relatively strong forces which serve to hold the wafer to the vacuum chuck are overcome during positioning of the wafer thereon.

Another feature of the present invention is the same as any one or more of the preceding features including means for sensing the angular position of the rotary loading arm and means responsive to the sensed position for arresting rotation of the loading arm in such a manner as to position the wafer being loaded at a predetermined location in the work area.

Another feature of the present invention is the same as any one or more of the preceding features wherein the loading platform includes a recessed off-loading portion into which the rotary loading arm slides the wafer being off-loaded from the work area.

Another feature of the present invention is the same as the preceding feature including the provision of a receptacle for receiving off-loaded wafers and means for engaging an off-loaded wafer and sliding it into this receptacle.

Other features and advantages of the present invention will become apparent upon a perusal of the following specification taken in connection with the accompanying drawings.

DESCRIPTION OF THE PREFERRED EMBODIMENT

Figure 1:
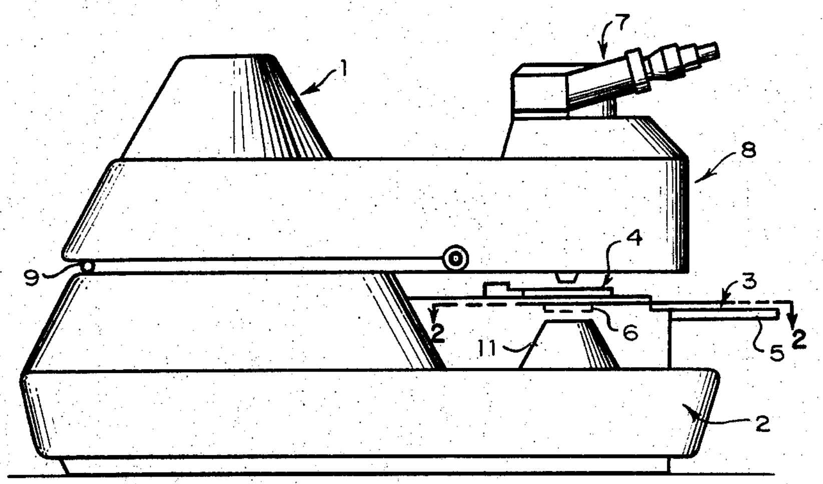
FIG. 1 is a side elevational view of an optical ailgnment and exposure apparatus incorporating features of the present invention.

Referring now to FIG. 1, there is shown an optical alignment and exposure device 1 incorporating features of the present invention. This device is of the same general type disclosed and claimed in the aforementioned U.S. Pat. 3,490,846 and includes a base unit 2, which houses a wafer loader 3 and carries a mask holder 4. Wafer loader 3 includes a loading platform 5 and a vacuum chuck assembly (not shown in FIG. 1) for holding a wafer 6 and driving it into engagement with a mask supported by the mask holder. In order that the wafer may be properly aligned with the mask, the wafer and the mask are provided with alignment marks that may be observed through a microscope 7 housed in an optical unit 8 disposed over and hinged to the base unit 2 at 9. A mechanical manipulator 11 is provided in base unit 2 for producing relative movement between the wafer 6 supported by the vacuum chuck assembly and the mask supporated by the mask holder 4 to properly align the wafer and the mask while they are positioned out of engagement with one another. When the proper alignment is obtained, the vacuum chuck assembly is raised to bring the wafer 6 into engagement with the mask. The wafer 6 is then exposed through the mask by directing a beam of ultraviolet light from a light source contained within optical unit 7 through the mask onto the wafer.

Transistors, integrated circuits, and the like are fabricated by processing semiconductive wafers 6. During this processing, each semiconductive wafer is exposed through the mask, as described above, off-loaded from loading platform 5, and further processed. Normally, each semiconductive wafer is repetitively aligned and exposed by the optical alignment and exposure device of FIG. 1 during a number of different steps with a different mask being used for each step. Each time the wafer is exposed, it must be precisely aligned with the mask through which it is exposed.

Figure 2:
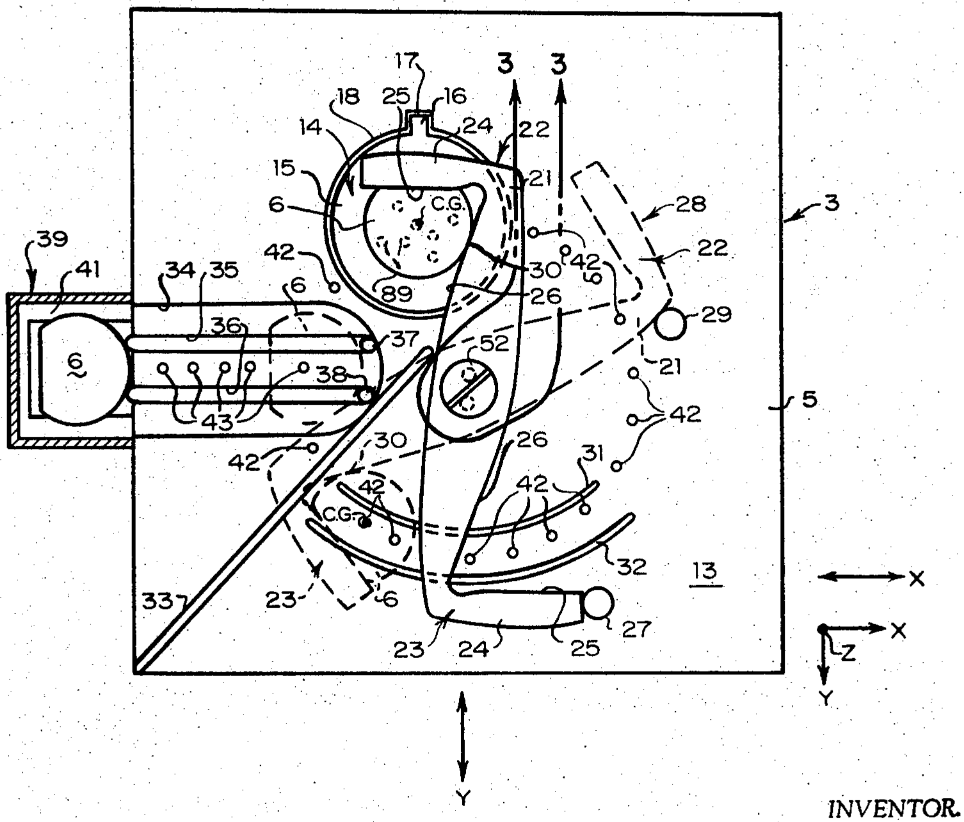
FIG. 2 is an enlarged plan view of a portion of the wafer loading apparatus of FIG. 1 taken along lines 2—2 in the direction of the arrows.
Figure 3:
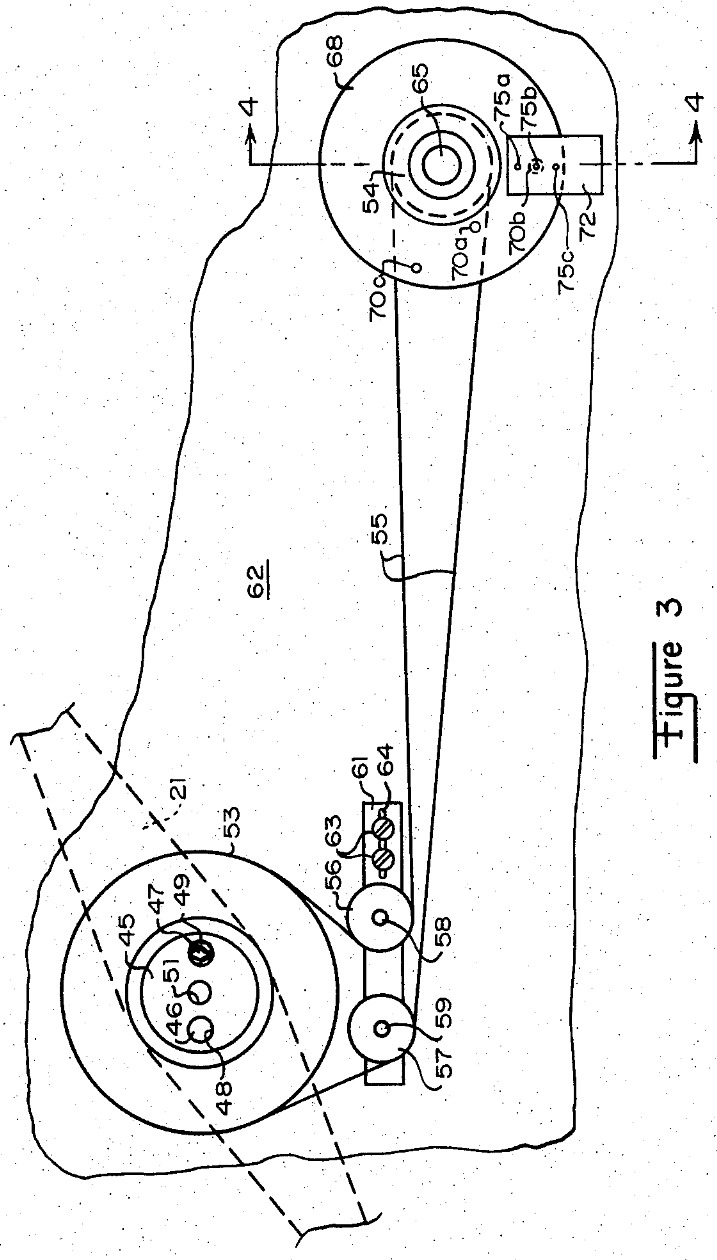
FIG. 3 is an enlarged detailed view of the rotary loading arm drive mechanism underlying the region of FIG. 2 delineated by line 3—3.
Figure 5:
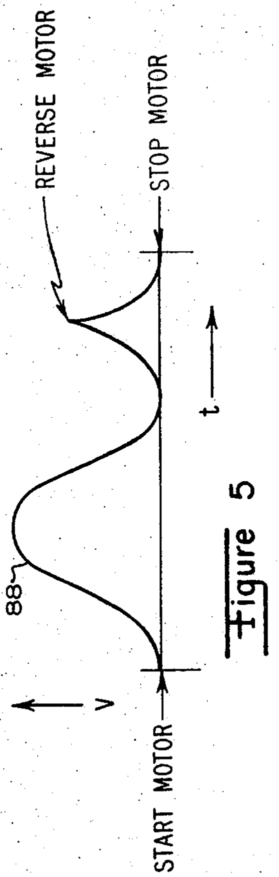
FIG. 5 is a plot of angular velocity versus time depicting the start up and stop motion of the rotary loading arm of FIG. 2.
Figure 4:
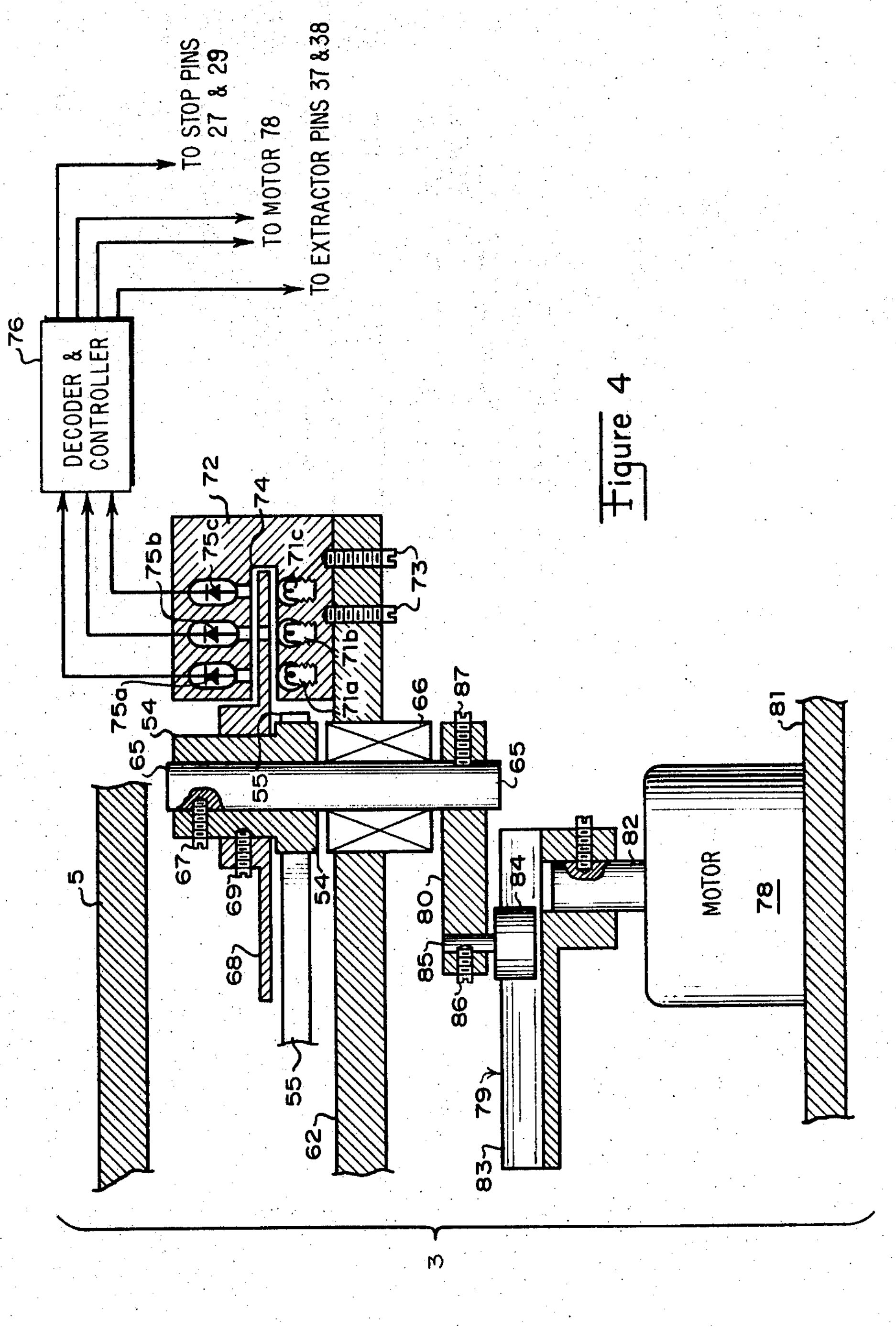
FIG. 4 is an enlarged sectional view, partly schematic, of a portion of the structure of FIG. 3 taken along line 4—4 in the direction of the arrows.

Referring now to FIG. 2, there is shown wafer loading apparatus 3 incorporating features of the present invention. Wafer loading apparatus 3 includes loading platform 5, which has a flat loading surface 13 for receiving a wafer 6 to be loaded onto a work area 14. The work area 14 is defined by the top of a vacuum chuck 15. Vacuum chuck 15 comprises a plunger provided with a key 16 for riding in a key slot 17 formed in the lip of a circular aperture 18 in loading platform 5. When vacuum chuck 15 is in its wafer loading position, the top of the vacuum chuck is flush with loading surface 13 of loading platform 5.

Loading platform 5 and vacuum chuck 15 are adjustable in the X and Y direction in the plane of and parallel to loading surface 13 of the loading platform. This is accomplished by means of a lever having a pair of selectable spaced fulcrums to provide different mechanical advantages for coarse and fine alignment adjustments of the loading platform and the vacuum chuck relative to mask holder 4. Vacuum chuck 15 is also movable in the Z direction normal to the plane of loading surface 13 for positioning a wafer 6 loaded thereon closer to or in contact with the mask supported by mask holder 4. This is accomplished by applying fluid pressure to a drive piston for supporting the vacuum chuck and raising it toward the mask holder. The wafer 6 is typically a circular silicon or germanium wafer of, for example, one to four inches in diameter and approximately 0.020 inch in thickness with a flat or chord cut from one side edge of the circular wafer for registering the wafer in the wafer loading apparatus, as more fully described below.

A rotary wafer loading arm 21 of, for example, 0.063 sheet steel is pivotably mounted relative to loading platform 5 by being affixed to a shaft extending through the loading platform in the Z direction. Rotary wafer loading arm 21 is thin and generally Z-shaped having a pair of forked wafer receiving portions 22 and 23 at diametrically opposite ends thereof. Forked portions 22 and 23 each include a generally circumferentially directed member 24 with a straight edge portion 25 for engaging the flat side edge of a respective wafer 6. They also each include a radially directed part of loading arm 21 with a straight edge portion 26 for engaging a circular side edge of the respective wafer 6 at a point of tangency 30 to precisely position the wafer relative to loading arm 21. The point of tangency 30 between straight edge portion 26 and the circular side edge of the respective wafer 6 is inboard of the center of gravity C.G. of the wafer.

Loading arm 21 is pivotable about an axis extending in the Z direction and is positioned relative to vacuum chuck 15 such that when the loading arm is rotated counterclockwise into a work area position, as shown by the solid lines in FIG. 2, a wafer 6 engaged by the forked portion 22 then located over the vacuum chuck is positioned on the vacuum chuck in a precisely predetermined location to ±0.001 inch. This facilitates the coarse and subsequent fine alignment adjustments of the vacuum chuck and the wafer supported thereon relative to the mask. The precise work area position of loading arm 21, when it comes to rest over vacuum chuck 15 for depositing thereon a wafer 6 engaged by either of the forked portions 22 or 23, is determined by the positioning of a retractable stop pin 27 carried by loading platform 5 and raised, for example, under fluid pressure to engage the end of the other of the forked portions 22 or 23 and thereby arrest counterclockwise rotation of the loading arm.

After a wafer 6 has been deposited in the work area position on vacuum chuck 15, loading arm 21 is rotated clockwise a sufficient amount for the loading arm to clear the vacuum chuck so that the vacuum chuck can raise the wafer supported thereon to a position closer to the mask in preparation for alignment with and exposure through the mask. The clockwise rotation of loading arm 21 is arrested in a loading position, as shown by phantom lines 28 in FIG. 2. The loading position is determined by the positioning of a second retractable stop pin 29 carried by loading platform 5 and raised, for example, under fluid pressure to engage and thereby arrest the clockwise rotation of the loading arm 21.

After the wafer 6 supported on vacuum chuck 15 has been aligned with and exposed through the mask, the vacuum chuck is retracted to its loading position so that the top of the vacuum chuck is flush with loading surface 13 of loading platform 5. Loading arm 21, which is then in the loading position indicated by phantom lines 28 in FIG. 2, may then be loaded by placing the next wafer 6, which is to be aligned with and exposed through the mask, in forked portion 23 of the loading arm 21. Two circumferentially directed grooves 31 and 32 are provided in loading surface 13 of loading platform 5 in the region where wafers are loaded into the forked portions of loading arm 21. This facilitates the loading of a wafer by allowing tweezers or other holding devices for the wafer to extend into grooves 31 and 32 while the wafer is being loaded. A generally radially directed groove 33 is also provided such that small particles and the like deposited upon loading surface 13 can be swept into groove 33 to remove them from loading platform 5.

After the next wafer 6 to be aligned with and exposed through the mask has been loaded into forked portion 23 of loading arm 21, stop pins 27 and 29 are retracted below loading surface 13 and the loading arm is rotated in the counterclockwise direction. Stop pins 27 and 29 are retracted by removing the fluid pressure applied thereto. They may also be downwardly spring biased to facilitate their retraction. As the next wafer 6 to be aligned with and exposed through the mask is moved by forked portion 23 of the loading arm into the work area position on vacuum chuck 15, the previously aligned and exposed wafer 6 to be off-loaded from the vacuum chuck is engaged by forked portion 22 of the loading arm and moved into an off-loading recess 34 of, for example 0.100 inch in depth in loading surface 13 of loading platform 5. More particularly, after stop pins 27 and 29 have been retracted and while loading arm 21 is rotated in the counterclockwise direction over off-loading recess 34, the previously exposed wafer 6 drops from forked portion 22 of the loading arm into the off-loading recess. A pair of slots 35 and 36 are provided in the bottom of off-loading recess 34, and a pair of extractor pins 37 and 38 are longitudinally translatably mounted within these slots. Portions of extractor pins 37 and 38 extend above the bottom surface of off-loading recess 34 to engage a side edge of the previously exposed wafer 6 deposited in the off-loading recess. Extractor pins 37 and 38 are moved longitudinally of slots 35 and 36, for example, under fluid pressure to push the previously exposed and off-loaded wafer 6 into a compartment 41 of a cartridge type receptacle 39. Each off-loaded wafer 6 is stacked in a separate compartment 41 of receptacle 39. After each off-loaded wafer 6 is deposited in its respective compartment 41 of receptacle 39, extractor pins 37 and 38 are returned to their starting position for engaging the next off-loaded wafer 6, and receptacle 39 is advanced one notch in the Z direction to drop the next compartment 41 into position for receiving the next off-loaded wafer. Extractor pins 37 and 38 are returned to their starting position by removing the fluid pressure applied thereto. They may also be spring biased toward their starting position to facilitate their return.

A circular array of perforations 42 is provided in loading surface 13 of loading platform 5 along the paths of the wafers 6 being loaded onto and off-loaded from vacuum chuck 15. Perforations 42 are connected to a source of vacuum thereby applying a vacuum to the wafers and holding them on loading surface 13 as they slide therealong. A linear array of similarly evacuated perforations 43 is provided along the path of the off-loaded wafers in off-loading recess 34 to hold them on the floor of the off-loading recess as they are moved into compartments 41 of receptacle 39.

Referring now to FIGS. 2–5, the control and drive structure for wafer loading apparatus 3 will be more fully described. Wafer loading arm 21 is affixed to a rotatable shaft 45 via a pair of pins 46 and 47, which extend above the end surface of shaft 45, to be received within a pair of circular holes 48 and 49, respectively, in the loading arm. Pin 46 is substantially the same size and shape as hole 48 to precisely determine the longitudinal positioning of loading arm 21, whereas pin 47 is of a diamond cross section with the end points of the diamond engaging the inside walls of hole 49 at circumferentially spaced points to precisely determine the angular positioning of loading arm 21 relative to shaft 45. A centrally tapped bore 51 in shaft 45 receives a holding screw 52 (see FIG. 2) for capturing loading arm 21 on shaft 45.

Shaft 45 extends through loading platform 5 of wafer loading apparatus 3 and is supported from the loading platform via the intermediary of a suitable ball bearing assembly (not shown). The lower end of shaft 45 extends below loading platform 5 and has a pulley 53 affixed thereto. Pulley 53 is driven from a drive pulley 54, of half the size of pulley 53, via the intermediary of a timing belt 55 which runs around a pair of idler pulleys 56 and 57 for maintaining tension of the timing belt. Pulleys 56 and 57 are mounted by shafts 58 and 59 on an adjustable bar 61, which is in turn mounted on a support plate 62 underlying loading platform 5 by a pair of screws 63 extending through an elongated adjustment slot 64 in bar 61.

Figure 6:
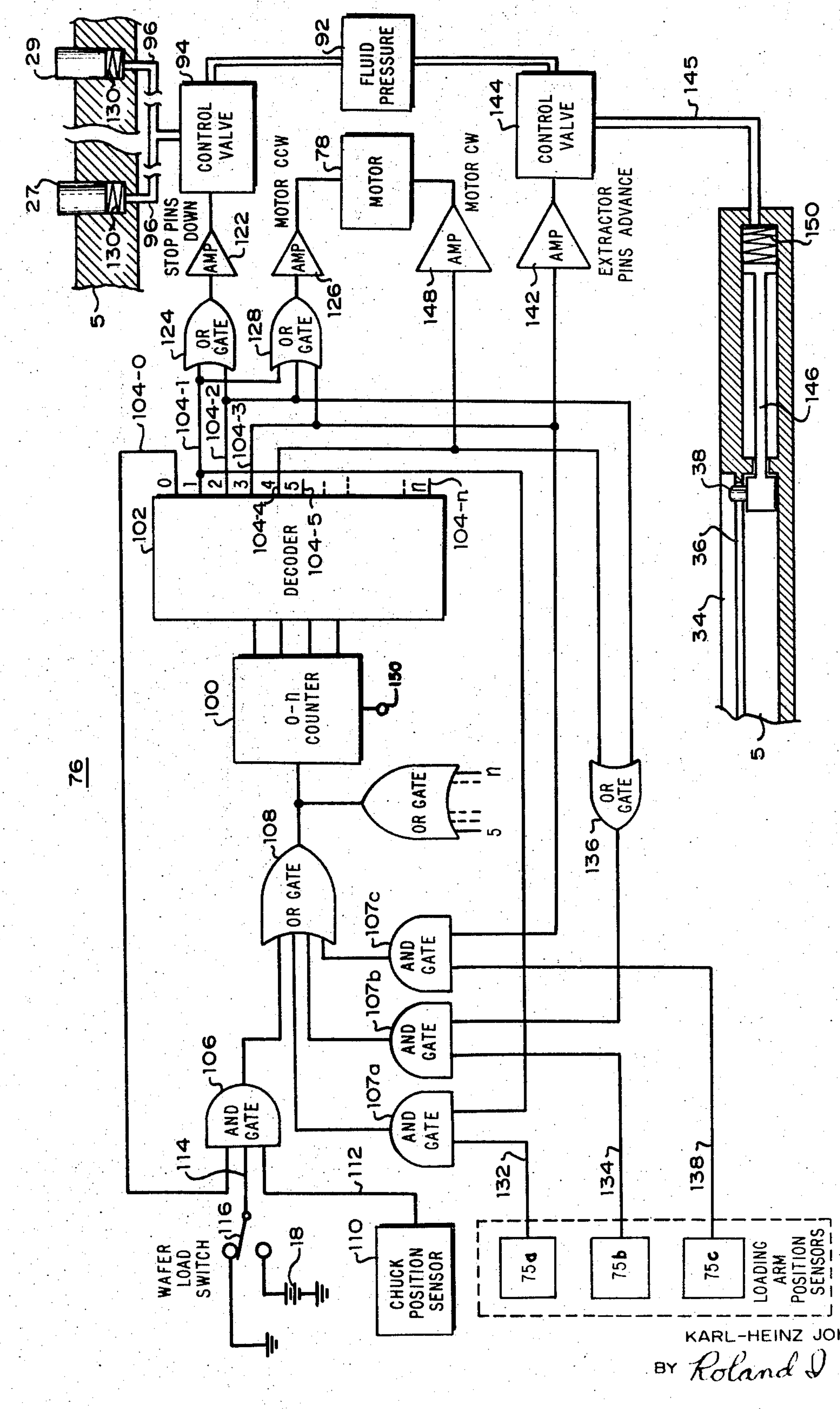
FIG. 6 is a schematic diagram of the decoder and controller of FIG. 4.

Drive pulley 54 is affixed by a set screw 67 to a drive shaft 65 rotationally supported by support plate 62 via the intermediary of a bearing 66. A coded disc 68 is affixed to the hub of pulley 54 by a set screw 69. Coded disc 68 includes, for example, three apertures 70*a–c* extending therethrough at different radial and angular positions. Three light sources 71*a–c*, each corresponding to a different one of the apertures 70*a–c*, are supported in a decoding housing 72 affixed to support plate 62 by screws 73. Decoding housing 72 has a slot 74 through which coded disc 68 and apertures 70*a–c* therein rotate with rotation of drive shaft 65. Light sources 71*a–c* are supported in radial alignment relative to coded disc 68 and directly beneath the paths of the corresponding apertures 70*a–c* through slot 74 so that each light source directs light through the corresponding aperture when the corresponding aperture is rotated into vertical alignment therewith. Three photodiodes 75*a–c*, each corresponding to a different one of the apertures 70*a–c*, are also supported in decoding housing 72 directly above the paths of the corresponding apertures through slot 74 and in vertical alignment with light sources 71*a–c* so that each photodiode detects the light passing through the corresponding aperture when the corresponding aperture is rotated into vertical alignment with the light source and photodiode corresponding thereto. The outputs of photodiodes 75*a–c* are fed to the input of a decoder and controller 76 described below in connection with FIG. 6.

Due to the fact that drive pulley 54 affixed to shaft 65 is half the size of pulley 53 affixed to shaft 45, coded disc 68 affixed to shaft 65 makes one complete revolution for each one-half revolution of rotary loading arm 21 affixed to shaft 45. The angular position of each of the apertures 70*a–c* in coded disc 68 therefore corresponds to a precise angular position of loading arm 21 during each one-half revolution thereof. Thus, apertures 70*a–c* are located in coded disc 68 at angular positions generally corresponding to a clear position described below, the loading position determined by the position of pin 29, and the work area position determined by the position of pin 27.

Drive shaft 65 is driven from a relatively low speed synchronous stepping motor 78, such as a synchronous motor model SS–25 manufactured by Superior Electric Company and sold under the trademark "Slo-Syn," via the intermediary of an eccentric drive mechanism comprising a cam lever 79 and a cam follower arm 80. Motor 78 is mounted on a support plate 81 underlying loading platform 5 and support plate 62 and is positioned so that drive shaft 82 of the motor is eccentrically disposed relative to drive shaft 65 supported by support plate 62. Loading platform 5 and underlying support plates 62 and 81 are interconnected as an integral rigid unit. Cam lever 79, which is affixed to drive shaft 82 of the motor, includes a rectangular cam slot 83, which receives a ball bearing cam follower 84 pinned to cam follower arm 80 via a shaft 85. Shaft 85 is fixedly secured to cam follower arm 80 via a set screw 86. Cam follower arm 80 is affixed to drive shaft 65 via a set screw 87.

The eccentric positioning of drive shafts 82 and 65 and the positioning of cam lever 79 and cam follower arm 80 are arranged so that drive shaft 65 and, hence, rotary loading arm 21 are driven at an angular velocity varying sinusoidally with time. More particularly, the angular velocity ($v$) of loading arm 21 versus time ($t$) for the first half cycle of rotation of the loading arm is shown by curve 88 in FIG. 5. Cam lever 79, cam follower arm 80, coded disc 68, and loading arm 21 are coupled together in relative position such that when the loading arm is in the loading position indicated by phantom lines 28 in FIG. 2 and motor 78 is energized for driving shaft 65 in a counterclockwise direction, cam lever 79 and, hence, loading arm 21 are initially rotated at a substantially constant angular velocity. However, due to the eccentric cam arrangement, the angular velocity of cam lever 79 and, hence, of loading arm 21 changes with time as shown by curve 88 of FIG. 5. More particularly, loading arm 21 starts out being rotated in a counterclockwise direction at a relatively low angular velocity that increases, then decreases, and then increases again as the loading arm begins to slide a wafer 6 to be aligned with and exposed through the mask onto vacuum chuck 15. This is desirable so that the wafer has a relatively high velocity as it moves onto vacuum chuck 15 for overcoming the relatively high drag produced by a vacuum drawn through perforations 89 in the top of the vacuum chuck. The angular velocity of loading arm 21 continues increasing until the loading arm is arrested by stop pin 27 and the wafer thereby deposited in the work area position on the vacuum chuck and then decreases again as the loading arm is retracted clear of the vacuum chuck. Once the wafer is in the work area position on vacuum chuck 15, the wafer is held in place by the vacuum drawn through perforations 89 in the top surface of the vacuum chuck.

One loading cycle in the operation of wafer loading apparatus 3 will now be described with the aid of FIGS. 2–4 and 6, assuming initially that stop pins 27 and 29 are raised by application of fluid pressure from a source of fluid pressure 92 to the bottom ends of the stop pins through a normally open control valve 94 and a pair of conduits 96; that loading arm 21 is in the loading position abutting upon raised stop pin 29, as indicated by phantom lines 28 in FIG. 2; that a wafer 6 to be loaded onto vacuum chuck 15 and subsequently aligned with and exposed through a mask supported by mask holder 4 (see FIG. 1) is positioned on loading surface 13 in engagement with forked portion 23 of the loading arm; that a previously aligned and exposed wafer 6 to be off-loaded from the vacuum chuck is supported thereon; that extractor pins 37 and 38 are in their starting position for engaging the previously exposed wafer 6 when it is subsequently deposited in off-loading recess 34; that aperture **70*b* of coded disc 68 is positioned slightly beyond (in a clockwise sense) the vertical alignment axis of the corresponding light source 71*b* and photodiode 75*b*; that a counter 100** having "0" through "*n*" sequential and mutually exclusive counting states is in the "0" counting state; and that vacuum chuck 15 is in its loading position.

A decoder 102 is connected to the output of counter 100 and is responsive to each of the "0" through "*n*" counting states of counter 100 for energizing a corresponding different one of "0" through "*n*" output lines 104–0 through **104–*n*. Since counter 100 is initially in the "0" counting state, decoder 102 initially energizes the "0" output line 104–0. This output line is connected to a control input of an AND gate 106. The output of AND gate 106 and the outputs of AND gates 107*a–c* are connected by an OR gate 108 to the input of counter 100. A chuck position sensor 110 detects the loading position of vacuum chuck 15 and accordingly energizes a line 112 connected to another control input of AND gate 106. The energization of lines 104–0 and 112 conditions AND gate 106 to supply counter 100 with a first trigger signal in response to susbsequent energization of a line 114 connected to a signal input of AND gate 106**.

The operator initiates the loading cycle by actuating a wafer load switch 116 to connect a source of energizing potential 118 to line 114. Being preconditioned by the energization of lines 104–0 and 112, AND gate 106 thereupon supplies counter 100 with a first trigger signal. This sets counter 100 to the "1" counting state whereupon decoder 102 energizes the "1" output line 104–1, which is connected to a control input of AND gate **107*a*, to an amplifier 122 via an OR gate 124, and to another amplifier 126 via an OR gate 128. In response to the energization of output line 104–1, amplifier 122 actuates normally open control valve 94 to close and vent conduits 96 to the atmosphere thereby removing the fluid pressure applied to stop pins 27 and 29 and lowering them below loading surface 13 with the aid of springs 130. Concomitantly, amplifier 126 energizes motor 78 to rotate coded disc 68 and loading arm 21 in a counterclockwise direction. The energization of output line 104–1 also conditions AND gate 107*a* to supply counter 100 with a second trigger signal is response to subsequent energization of a line 132 connected to a signal input of AND gate 107*a***.

The counterclockwise rotation of loading arm 21 moves forked portion 23 and the unexposed wafer 6 engaged thereby counterclockwise toward vacuum chuck 15 while at the same time moving forked portion 22 counterclockwise toward engagement with the previously exposed wafer 6 supported on the vacuum chuck. Slightly after loading arm 21 leaves the loading position, the counterclockwise rotation of coded disc 68 momentarily moves aperture **70*b* counterclockwise into vertical alignment with the corresponding light source 71*b* and photodiode 75*b*. In response to the light thereupon passing from light source 71*b* through aperture 70*b*, photodiode 75*b* momentarily energizes a line 134 connected to a signal input of AND gate 107*b*. However, this has no effect on the loading cycle because AND gate 107*b* is not conditioned to respond to the energization of line 134**.

When forked portion 22 reaches the clear position (this occurs slightly before forked portion 22 reaches vacuum chuck 15), the counterclockwise rotation of coded disc 68 momentarily moves aperture **70*a* counterclockwise into vertical alignment with the corresponding light source 71*a* and photodiode 75*a*. In response to the light thereupon passing from light source 71*a* through aperture 70*a*, photodiode 75*a* momentarily energizes line 132. Being preconditioned by the energization of output line 104–1, AND gate 107*a* thereupon supplies counter 100 with a second trigger signal. This sets counter 100 to the "2" counting state whereupon decoder 102 energizes the "2" output line 104–2, which is connected to a control input of AND gate 107*b* via an OR gate 136, to amplifier 122 via OR gate 124, and to amplifier 126 via OR gate 128. In response to the energization of output line 104–2, amplifier 122 continues actuating control valve 94 as required to hold stop pins 27 and 29 down, and amplifier 126 continues energizing motor 78 to rotate coded disc 68 and loading arm 21 in the counterclockwise direction. The energiaztion of output line 104–2 also conditions AND gate 107*b* to supply counter 100 with a third trigger signal in response to subsequent energization of line 134**.

The continued counterclockwise rotation of loading arm 21 moves forked portion 23 and the unexposed wafer 6 engaged thereby further counterclockwise toward the work area position on vacuum chuck 15 while at the same time moving forked portion 22 counterclockwise into engagement with the previously exposed wafer 6 supported on the vacuum chuck and then onward with the previously exposed wafer 6 toward stop pin 27. Slightly before forked portion 22 engages the previously exposed wafer 6 supported on vacuum chuck 15, the continued counterclockwise rotation of coded disc 68 momentarily moves aperture **70*c* counterclockwise into vertical alignment with the corresponding light source 71*c* and photodiode 75*c*. In response to the light thereupon passing from light source 71*c* through aperture 70*c*, photodiode 75*c* momentarily energizes a line 138 connected to a signal input of AND gate 107*c*. However, this has no effect on the loading cycle because AND gate 107*c* is not conditioned to respond to the energization of line 138**.

As forked portion 22 moves past off-loading recess 34, the previously exposed wafer 6 then engaged by forked portion 22 drops into the off-loading recess. Slightly after forked portion 22 leaves the initial loading position of forked portion 23, the continued counterclockwise rotation of coded disc 68 again momentarily moves aperture 70*b* counterclockwise into vertical alignment with the corresponding light source 71*b* and photodiode 75*b*. In response to the light passing from light source 71*b* through aperture 75*b*, photodiode 75*b* again momentarily energizes line 134. Being preconditioned by the energization of output line 104–2, AND gate 107*b* thereupon supplies counter 100 with a third trigger signal. This sets counter 100 to the "3" counting state whereupon decoder 102 energizes the "3" output line 104–3, which is connected to a control input of AND gate 107*c*, to an amplifier 142, and to amplifier 126 via OR gate 128. Output line 104–3 is not connected to amplifier 122. Thus, in response to the energization of output line 104–3, fluid pressure is once again applied to the bottom ends of stop pins 27 and 29 through normally open control valve 94 and conduits 96, thereby raising the stop pins. Concomitantly, amplifier 142 actuates a normally closed control valve 144 to open and thereby apply fluid pressure from the source of fluid pressure 92 through control valve 144 and a conduit 145 to a plunger 146 on which extractor pins 37 and 38 are mounted. This causes extractor pins 37 and 38 to move the previously exposed wafer 6 deposited in off-loading recess 34 into a compartment 41 of cartridge 39. The energization of output line 104–3 also causes amplifier 126 to continue energizing motor 78 as required to rotate coded disc 68 and loading arm 21 in the counterclockwise direction and conditions AND gate 107*c* to supply counter 100 with a fourth trigger signal in response to subsequent energization of line 138.

As loading arm 21 continues to move the unexposed wafer 6 engaged by forked portion 23 counterclockwise toward the work area position on vacuum chuck 15, coded disc 68 again momentarily moves aperture 70*a* counterclockwise into vertical alignment with the corresponding light source 71*a* and photodiode 75*a* whereupon photodiode 75*a* again momentarily energizes line 132. However, this has no effect on the loading cycle because AND gate 107*a* is not conditioned to respond to energization of line 132.

Slightly before forked portion 23 and the unexposed wafer 6 engaged thereby reach the work area position on vacuum chuck 15, coded disc 68 again momentarily moves aperture 70*c* counterclockwise into vertical alignment with the corresponding light source 71*c* and photodiode 75*c* whereupon photodiode 75*c* momentarily energizes line 138. Being preconditioned by the energization of output line 104–3, AND gate 107*c* thereupon supplies counter 100 with a fourth trigger signal. This sets counter 100 to the fourth counting state whereupon decoder 102 energizes the "4" output line 104–4, which is connected to the control input of AND gate 107*b* via OR gate 136 and to amplifier 148. Output line 104–4 is not connected to amplifiers 122, 126, or 142. Thus, in response to the energization of output line 104–4, normally closed control valve 144 closes and vents conduit 145 to the atmosphere thereby removing the fluid pressure applied to plunger 146 and returning extractor pins 37 and 38 to their starting position with the aid of a spring 150. Concomitantly, stop pins 27 and 29 stay raised under fluid pressure, amplifier 126 stops energizing motor 78 thereby stopping the motor from rotating loading arm 21 and coded disc 68 in the counterclockwise direction, and amplifier 148 begins energizing the motor to rotate the loading arm and the coded disc in a clockwise direction. The energization of output line 104–4 also conditions AND gate 107*b* to supply counter 100 with a fifth trigger signal in response to subsequent energization of line 134. Aperture 70*c* is positioned for detection slightly before loading arm 21 reaches the work area position so that the inertial counterclockwise movement of the loading arm between the detection of aperture 70*c* and the actual reversal of motor 78, and, hence, of the direction of rotation of the loading arm, brings the end of forked portion 22 into abutment upon raised stop pin 27 thereby momentarily arresting the loading arm and depositing the unexposed wafer 6 engaged by forked portion 23 in the precise desired work area position on vacuum chuck 15.

The clockwise rotation of loading arm 21 moves forked portion 22 clockwise back toward the initial loading position of forked portion 23 while at the same time moving forked portion 23 clockwise back out of the way of vacuum chuck 15. Concomitantly, the clockwise rotation of coded disc 68 momentarily moves aperture 70*c* and then aperture 70*a* clockwise into vertical alignment with their corresponding light sources and photodiodes thereby momentarily energizing lines 138 and 132. However, this has no effect on the loading cycle because AND gates 107*c* and 107*a* are not conditioned to respond to the energization of lines 138 and 132.

Slightly before forked portion 22 reaches the initial loading position of forked portion 23, coded disc 68 momentarily moves aperture 70*b* clockwise into vertical alignment with the corresponding light source 71*b* and photodiode 75*b* whereupon photodiode 75*b* momentarily energizes line 134. Being preconditioned by the energization of output line 104–4, AND gate 107*b* thereupon supplies counter 100 with a fifth trigger signal. This sets counter 100 to the "5" counting state whereupon decoder 102 energizes the "5" output line 104–5. This output line is not connected to amplifiers 122, 126, 142, or 148. Thus, in response to the energization of output line 104–5, amplifier 148 stops energizing motor 78 thereby stopping the motor from rotating loading arm 21 and coded disc 68 in the clockwise direction. Concomitantly, stop pins 27 and 29 remain raised under fluid pressure, and extractor pins 37 and 38 remain in their starting position. Aperture 70*b* is positioned for detection slightly before loading arm 21 reaches the loading position so that the inertial clockwise movement of the loading arm between the detection of aperture 70*b* and the actual stopping of motor 78, and, hence, of the loading arm, brings the loading arm into abutment upon raised stop pin 29 thereby arresting forked portion 22 in the initial loading position of forked portion 23. Forked portion 22 is then in position for subsequently receiving the next wafer 6 to be loaded onto vacuum chuck 15 and thereafter aligned with and exposed through the mask. This completes one loading cycle of wafer loading apparatus 3.

Before the next loading cycle takes place the unexposed wafer 6 deposited in the work area position on vacuum chuck 15 is aligned with and exposed through the mask as generally described above. The remaining counting states of counter 100 and the remaining output lines of decoder 102 may be employed for controlling the raising and lowering of vacuum chuck 15, the advancing of receptacle 39, and the operation of other portions of the alignment and exposure device as required to align the wafer with the mask, thereafter expose the wafer through the mask, and position receptacle 39 for receiving the wafer after it has been exposed and deposited in off-loading recess 34.

Once the wafer has been aligned with and exposed through the mask and the vacuum chuck is lowered to its loading position, counter 100 is again set to the "0" counting state whereupon decoder 102 again energizes the "0" output line 104–0. Concomitantly, chuck position sensor 110 again energizes line 112. AND gate 106 is therefore again conditioned to supply counter 100 with a first trigger signal when the operator actuates wafer load switch 116 to initiate the next loading cycle.

The next loading cycle proceeds in the same manner as the above-described loading cycle and has the effect of off-loading the exposed wafer 6 then on vacuum chuck 15 into off-loading recess 34 and thence into a compartment 41 of receptacle 39, loading unexposed wafer engaged by forked portion 22 of the loading arm onto the vacuum chuck in the work area position, and retracting forked portion 23 of the loading arm to the loading position for receiving the next wafer to be aligned with and exposed through the mask. These loading cycles are repeated as many times as necessary until the desired number of wafers has been loaded onto the vacuum chuck, aligned with and exposed through the mask, and off-loaded from the vacuum chuck.

Counter 100 is provided with a reset input 150 so that the operator may reset the counter to the "0" counting state in preparation for the initiation of a new loading cycle (or off-loading cycle in the event a wafer is merely being removed from the vacuum chuck) at any time. If desired, a counter 100 having only "0" through "4" sequential and mutually exclusive counting states and a decoder 102 having only "0" through "4" corresponding output lines 104–0 through 104–4 may be employed. In this case, the detection of aperture **70*b* while coded disc 68 and loading arm 21 are rotated in the clockwise direction causes counter 100 to be reset to the "0" counting state whereupon decoder 102 energizes the "0" output line 104–0** in preparation for the next loading cycle.

The advantages of rotary wafer loading apparatus 3 of the present invention include the ability of the loading apparatus to operate at a much faster rate due to the relatively low mass and hence inertia of the rotating parts employed in the wafer loading apparatus. In addition, the relatively flat construction of rotary wafer loading arm 21 reduces the space required between loading platform 5 and the mask so that vacuum chuck 15 does not have to extend as far above loading platform 5 to bring a wafer 6 into close proximity to the mask for alignment and exposure. Moreover, rotary wafer loading arm 21 can be more easily provided with a sinusoidal angular velocity than can the reciprocating wafer loading and off-loading apparatus of the prior art. The rotation of coded disc 68 in a precise fixed relationship with rotary wafer loading arm 21 also greatly facilitates determining the precise position of the rotary wafer loading arm such that the wafer is more accurately positioned.

I claim:

1. In a wafer loading apparatus, loading platform means having a loading surface for receiving a wafer to be subsequently loaded into a work area and feed means for engaging the wafer and moving it along the loading surface of the loading platform means into the work area, the improvement wherein, said feed means comprises rotary feed means rotatably mounted with respect to the loading platform means and having a wafer engaging portion for engaging the side edge of the wafer at spaced points to move the wafer along the loading surface of the loading platform means into the work area.

2. The apparatus of claim 1 wherein said rotary feed means slides the wafer along the loading surface of the loading platform means from a loading area to the work area, said loading surface of the loading platform means has perforations along the path of the wafer from the loading area to the work area, and said apparatus includes means for reducing the atmospheric pressure in these perforations to hold the wafer on the loading surface of the loading platform means as the wafer slides therealong from the loading area toward the work area.

3. The apparatus of claim 1 wherein the wafer engaging portion of the rotary feed means includes at least a first forked portion for engaging the side edge of a first wafer at spaced points and a second forked portion for engaging the side edge of a second wafer at spaced points, said forked portions being arranged so that the rotary feed means may be rotated to push one of the first and second wafers, into the work area as it pushes the other of the first and second wafers away from the work area.

4. The apparatus of claim 3 wherein said loading platform means includes a recessed off-loading portion into which the rotary feed means slides the wafer pushed away from the work area.

5. The apparatus of claim 4 including receptacle means for receiving off-loaded wafers, and means for engaging an off-loaded wafer in the recessed off-loading portion of the loading platform means and sliding it into the receptacle means.

6. The apparatus of claim 1 including a chuck supported for movement through an aperture in the loading platform means and having a wafer receiving surface generally flush with the loading surface of the loading platform means when the chuck is in a wafer loading position, said wafer receiving surface of the chuck having perforations therein and forming the work area into which the rotary feed means slides the wafer, said apparatus further including means for reducing the atmospheric pressure in these perforations to hold the wafer on the wafer receiving surface of the chuck, means for moving the chuck relative to the loading platform means, and drive means for rotatably driving the rotary feed means with an angular velocity that increases as the wafer slides along the loading surface of the loading platform means onto the chuck.

7. The apparatus of claim 6 wherein said drive means includes a motor having an output shaft, includes a drive shaft coupled to the rotary feed means, and includes eccentric coupling means for coupling rotation of the output shaft to the drive shaft.

8. The apparatus of claim 1 including drive means for rotatably driving the rotary feed means, sensing means for sensing the angular position of the rotary feed means, and additional means responsive to the sensed position of the rotary feed means for arresting rotation of the rotary feed means to position the wafer in a predetermined location in the work area.

9. The apparatus of claim 8 wherein said sensing means includes a rotatable coded disc coupled to the rotary feed means, and means for reading this coded disc to sense the angular position of the rotary feed means.

10. The apparatus of claim 8 wherein said additional means includes means for de-energizing the drive means, and stop means for engaging the rotary feed means to arrest the rotation thereof.

11. The apparatus of claim 10 wherein said stop means includes a pin retractably mounted in said loading platform means.

12. In an optical alignment apparatus for aligning a mask and a wafer, holder means for holding the mask, chuck means for holding the wafer and moving it toward the mask, control means for moving one of the holder means and chuck means relative to the other to align the wafer with the mask, and loading means for loading the wafer onto the chuck means, said loading means including a loading platform having a loading surface for receiving the wafer, and a rotary feed means for engaging a side edge of the wafer at spaced points and sliding the wafer along the loading surface of the loading platform onto the chuck means.

13. The apparatus of claim 12 wherein said rotary feed means is operable for engaging the side edge of a first wafer at spaced points while at the same time engaging the side edge of a second wafer at spaced points and for rotating the first wafer from a loading station along the loading surface of the loading platform onto the chuck means while at the same time rotating the second wafer from the chuck means along the loading surface of the loading platform to an off-loading station.

14. The apparatus of claim 13 including sensing means for sensing the angular position of the rotary feed means, drive means responsive to the sensed angular position of the rotary feed means for reversibly driving the rotary feed means, and stop means responsive to the sensed angular position of the rotary feed means for arresting rotation of the rotary feed means in one direction to position the first wafer at a predetermined position on the chuck means and for thereafter arresting rotation of the rotary feed means in the opposite direction when it has cleared the chuck means to permit engagement of the rotary feed means with the side edge of another wafer at the loading station.

15. The apparatus of claim 14 wherein said sensing means includes both a rotatable coded disc coupled to the rotary feed means and means for reading this coded disc to sense the angular position of the rotary feed means, and wherein said stop means includes means for de-energizing the drive means, a first stop pin retractably mounted in the loading platform for engaging the rotary feed means to arrest rotation thereof in said one direction, and a second stop pin retractably mounted in the loading platform for engaging the rotary feed means to arrest rotation thereof in said opposite direction.

References Cited

UNITED STATES PATENTS

| | | | |
|---|---|---|---|
| 3,299,502 | 1/1967 | Wanesky | 29—203 VX |
| 3,490,846 | 1/1970 | Kasper | 355—78 |

THOMAS H. EAGER, Primary Examiner

U.S. Cl. X.R.

29—203 P, 203 V

UNITED STATES PATENT OFFICE
CERTIFICATE OF CORRECTION

Patent No. 3,700,567 Dated October 24, 1972

Inventor(s) Karl-Heinz Johannsmeier

It is certified that error appears in the above-identified patent and that said Letters Patent are hereby corrected as shown below:

Column 1, line 21, "unexpected" should read -- unexposed --;

Column 1, line 41, "there upon" should read -- thereupon --;

Column 6, line 54, "Slo-Syn," should read -- "Slo-Syn", --;

Column 7, line 1, after "arm is" insert -- as --;

Column 8, line 16, "is" should read -- in --;

Column 11, line 2, after "loading" insert -- an --;

Column 11, line 73, after "wafers" delete the comma.

Signed and sealed this 10th day of April 1973.

(SEAL)
Attest:

EDWARD M.FLETCHER,JR.
Attesting Officer

ROBERT GOTTSCHALK
Commissioner of Patents

FORM PO-1050 (10-69)
USCOMM-DC 60376-P69
☆ U.S. GOVERNMENT PRINTING OFFICE : 1969 O—366-334